United States Patent [19]
Calligaro et al.

[11] Patent Number: 5,986,921
[45] Date of Patent: Nov. 16, 1999

[54] CLOCK CIRCUIT FOR READING A MULTILEVEL NON VOLATILE MEMORY CELLS DEVICE

[75] Inventors: Cristiano Calligaro, Torre D'Isola; Nicola Telecco, Monreale; Guido Torelli, S. Alessio Con Vialone, all of Italy

[73] Assignee: SGS-Thomson Microelectronics S.r.l., Milan, Italy

[21] Appl. No.: 08/883,822

[22] Filed: Jun. 27, 1997

[30] Foreign Application Priority Data

Jun. 28, 1998 [EP] European Pat. Off. .............. 96830371

[51] Int. Cl.[6] .................................................. G11C 13/00
[52] U.S. Cl. ............................................ 365/149; 365/233
[58] Field of Search ..................................... 365/203, 205, 365/149, 189.01, 230.01, 233

[56] References Cited

U.S. PATENT DOCUMENTS

| | | | |
|---|---|---|---|
| 3,712,994 | 1/1973 | Graziani | 365/189.01 |
| 4,425,553 | 1/1984 | LaPierre | 331/74 |
| 4,504,749 | 3/1985 | Yoshida | 307/590 |
| 4,604,513 | 8/1986 | Lim | 219/12 KA |
| 4,939,382 | 7/1990 | Gruodis | 307/116 |
| 5,144,156 | 9/1992 | Kawasaki | 307/262 |

*Primary Examiner*—Terrell W. Fears
*Attorney, Agent, or Firm*—Jenkens & Gilchrist, P.C.

[57] ABSTRACT

A timing circuit for reading from a device comprising multi-level non-volatile memory cells, which circuit comprises a single programmable delay block connected to an input terminal for memory address line transition signals. The delay block drives a counter which feedback controls the discharge through a combinational logic circuit connected to the output terminal of the programmable delay block. A logic output circuit, connected to the output terminal of the delay block and to the counter, generates the timing signals.

28 Claims, 5 Drawing Sheets

CLOCK CIRCUIT FOR READING A MULTILEVEL NON VOLATILE MEMORY CELLS DEVICE

This invention relates to circuits for monolithically integrated storage devices, and in particular to a timing signal generating circuit for reading from non-volatile multi-storage or multi-level memories using a serial dichotomic or mixed dichotomic/parallel approach.

A non-volatile memory is usually interfaced to an electronic system by a bus of the asynchronous type. This means that, with the exception of certain specific applications involving high throughput rates, the non-volatile storage devices are circuits which are input no timing signals. Accordingly, the generation of the voltage signals ("phases") required for timing the read cycle is usually effected within the storage device itself from the ATD (Address Transition Detection), that is on a transition being detected on the address bus. The circuit is thus left in a standby condition until a read address is actually generated; this enables the device power dissipation to be minimized.

The reading from a conventional two-level non-volatile memory cell normally requires a phase of pre-charging the bit lines involved in the reading (sensing) operation, followed by the reading proper. For timing the precharge, a RC delay circuit controlled by the ATD signal is commonly used to control the effective time duration of the pre-charge signal.

On the other hand, reading from a multi-storage memory with a dichotomic or mixed parallel/dichotomic approach involves several timing phases, in order for the contents of the addressed cell to be correctly accessed in succession.

The present invention concerns a circuit for generating voltage phases of varying durations from a single RC delay assembly. This circuit is effective to "on-chip" generate the timing signals for the operations that make up the read cycle of a multi-storage memory.

A conventional architecture of the mixed parallel/dichotomic type for reading a sixteen-level multi-storage device, and capable of storing four information bits into each memory cell, will be taken as a comparison term.

The mixed parallel/dichotomic approach is a reading method by successive approximations which requires $m = \log_2^p(n)$ distinct reading steps, with n being the number of the information levels stored in the memory cell, and p the number of bits determined at each compare cycle. Specifically, the cells are assumed to have been programmed with different threshold values Vth, that is to be capable of delivering different currents under fixed read bias conditions. In the example, it is assumed that the device contains cells with sixteen levels of Vth, and that at the end of each compare cycle, two information bits are made available (from the first or coarse conversion, the two Most Significant Bits (MSBs) are obtained, whereas from the second or fine conversion, the two Least Significant Bits (LSBs) are obtained). In this case, n=16 and p=2, so that two successive reading steps are required.

The above architecture implements a current-based reading methodology through a succession of two parallel comparisons of the selected cell current with three reference currents, which are selected in accordance with the dichotomic algorithm for each comparison. To carry out each current comparison, the bit line that contains the selected cell and those containing the appropriate reference cells must be pre-charged. Therefore, each compare cycle will require two timing steps, a first or pre-charging step and a second or sensing step. In general, the time needed for pre-charging the bit lines is much longer than that required for sensing. Thus, to reduce the cell read time, it may be convenient if the first pre-charge is effected on all the reference bit lines; in this way, it would be possible to complete the second pre-charging operation within a shorter time than the first, since the bit lines would then be still partly pre-charged. Of course, the choice of having all the reference bit lines pre-charged initially involves a larger dissipation of power, because those bit lines which have not been selected by the dichotomic comparison algorithm would also be pre-charged.

By way of example only, assume the first pre-charging phase to take typically a time of about 40 ns, whereafter the first two MSBs will be sensed within a 10 to 15 ns time; the next pre-charging operation, when carried out on bit lines which have already been pre-charged, may require a much shorter time than 40 ns, to be estimated, in fact, at 10 to 20 ns. The final operation will be one of sensing the last two LSBs.

Illustrated in FIG. 1 is the quality of the signal forms needed for timing the reading from a two-level cell (FIG. 1.a) and a sixteen-level cell (FIG. 1.b). FIG. 1.b shows that the two pre-charge cycles are characterized by the timing signal being at a logic high, and the two sense cycles by the timing signal being at a logic low. Also shown therein are the ATD signals generated at each transition of the address bits. The reading operation is to start upon arrival of the last transition pulse, because the addressing and pre-charging operation must be carried out on the bit line actually indicated on the system bus. In practice, the pre-charging phase is to last for a predetermined time after the addresses have settled, if the pre-charging operation is to be effected correctly on the addressed bit line.

In order to have a timing signal generated upon the occurrence of a transition on the address bus, a circuit such as that shown in FIG. 2, and referred to as block RC hereinafter, may be used where a two-level memory is being read from.

With reference to FIG. 2, when a transition occurs on any one of the address pins, an ATD pulse is generated to discharge the capacitor CL down to a level close to 0 volt, whereafter it is charged back through the PMOS PL which is always conducting because of its gate being connected to ground. The charge time constant is given approximately as the capacitance value of CL multiplied by the resistance rds of PL, and therefore, can be adjusted by acting on the dimensions of the latter and the value of CL. By cascade connecting a chain of inverters to the block RC, a square output signal can be obtained and used to drive the pre-charge and read phases of a two-level cell. Specifically, when the signal is at a logic high, the precharge circuitry will be enabled, whereas with the signal low, the sensing phase proper will be initiated for the memory cell (cf. FIG. 1A).

The underlying technical problem of this invention is to provide a timing circuit, for reading from non-volatile memory cells of the multi-level type, which is both simple and highly reliable.

This technical problem is solved by a timing circuit as previously indicated and defined in the characterizing portions of the claims appended to this specification.

The features and advantages of a timing circuit according to the invention, can be appreciated from the following description of an exemplary, and non-limitative, embodiment thereof, to be read in conjunction with the accompanying drawings.

Figure 1A:
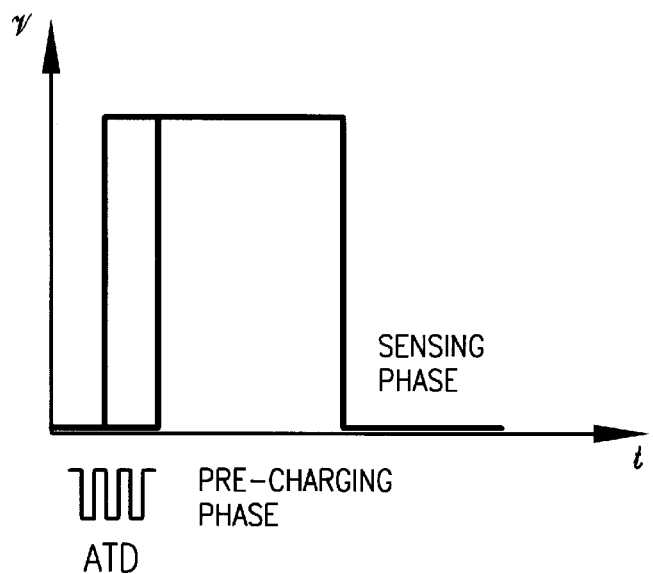
FIG. 1 shows the waveforms of timing signals for two-level reading (A) and multi-level reading (B)
Figure 1B:
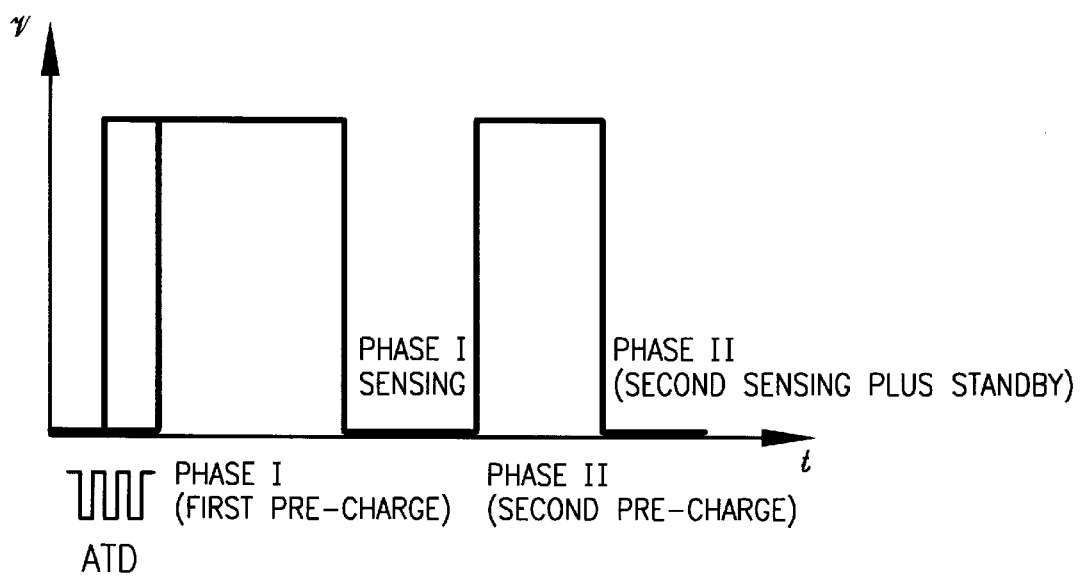
Figure 2:
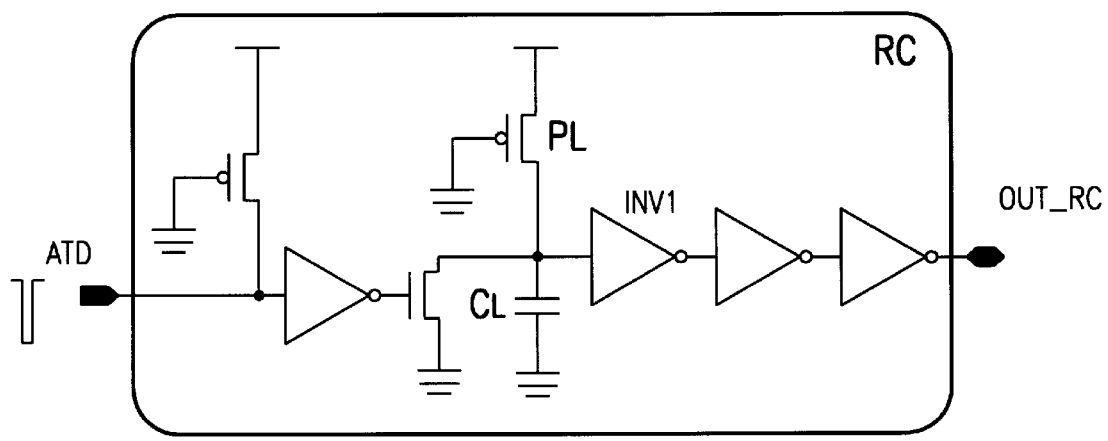
FIG. 2 shows a delay circuit RC generating a timing signal.

The inventive solution for having a suitable timing signal generated for reading from a multi-level cell (such as that shown in FIG. 1.b) comprises a circuit formed of a single delay block RC (substantially similar in construction and operation to that provided by the state of the art) which is driven in an appropriate manner. In practice, an "RC assembly" is provided wherein the value of CL is varied to suit each operational phase, thereby obtaining a desired value for the charging time at each phase of the read cycle. The time duration of each phase is set by the charging time of the "RC assembly" at that phase. Of course, the circuit includes a circuit for recognizing the operational phase at each time. This is accomplished by providing a counter driven by the edges of the block RC.

Figure 3:
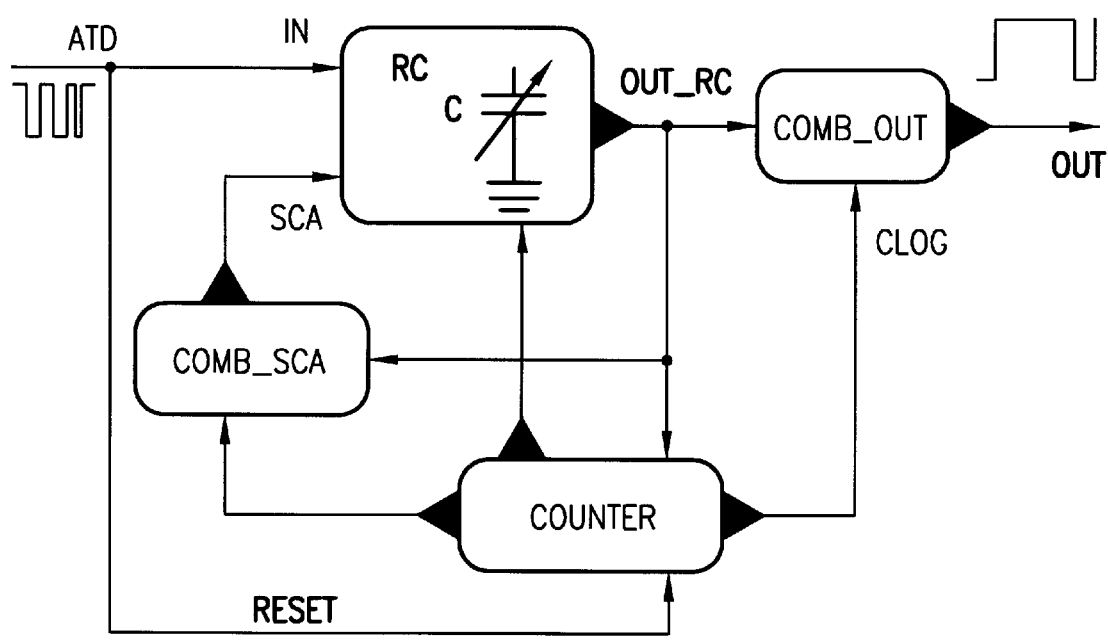
FIG. 3 is a block diagram of a timing circuit according to the invention.
Figure 4:
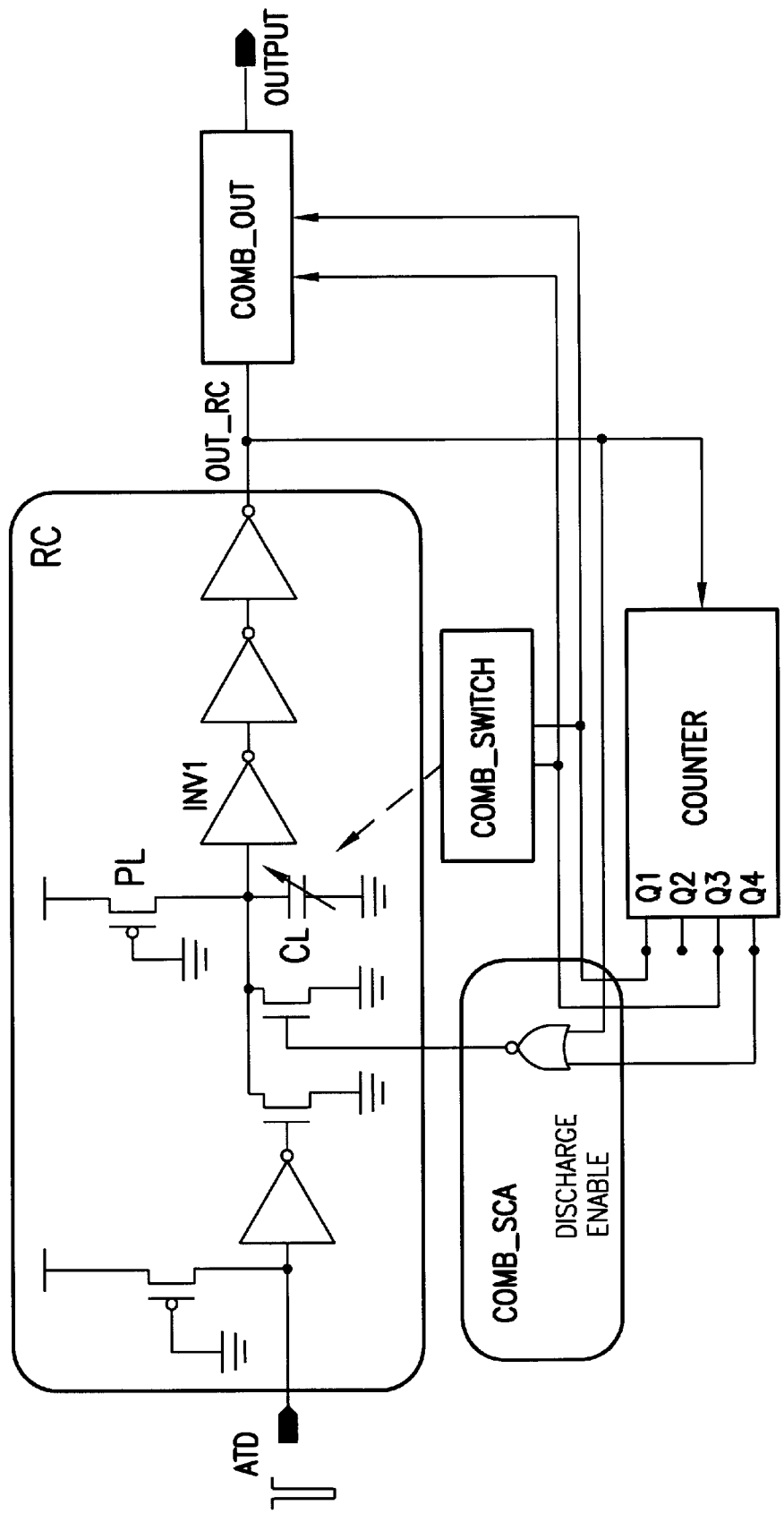
FIG. 4 is a block diagram of a timing circuit according to the invention, highlighting an exemplary embodiment of the delay block RC.

In the proposed circuit, illustrated by its functional elements in FIG. 3, the ATD signal serves a dual function: a first function is to supply the initial RC block discharge signal, and the second function is to generate a RESET pulse for the whole timing control circuitry. Referring to FIG. 4, which is a more detailed functional representation of the scheme proposed herein, the timing circuit is comprised of four basic elements, namely: a four-stage counter, a combinational logic block COMB_SWITCH, a second combinational logic block COMB_SCA, and a third block COMB_OUT. The last-mentioned block serves a logic output function. Blocks COMB_SWITCH and COMB_SCA jointly serve a function of time constant and discharge pulse control, and should be regarded as integral with block RC. The counter function is one of counting the number of discharge pulses of the block RC and supplying appropriate input signals to the combinational logic COMB_SWITCH. This logic enables the time constant of block RC to be adjusted at each charging phase by selective adjustment of the effective capacitance value of CL. Block COMB_SCA is functional to generate appropriate signals for controlling the discharge of RC at the end of each charging phase. Finally, the circuitry of COMB_OUT functions to build the final timing signal, based on the signal from block RC and the counter state.

Figure 5:
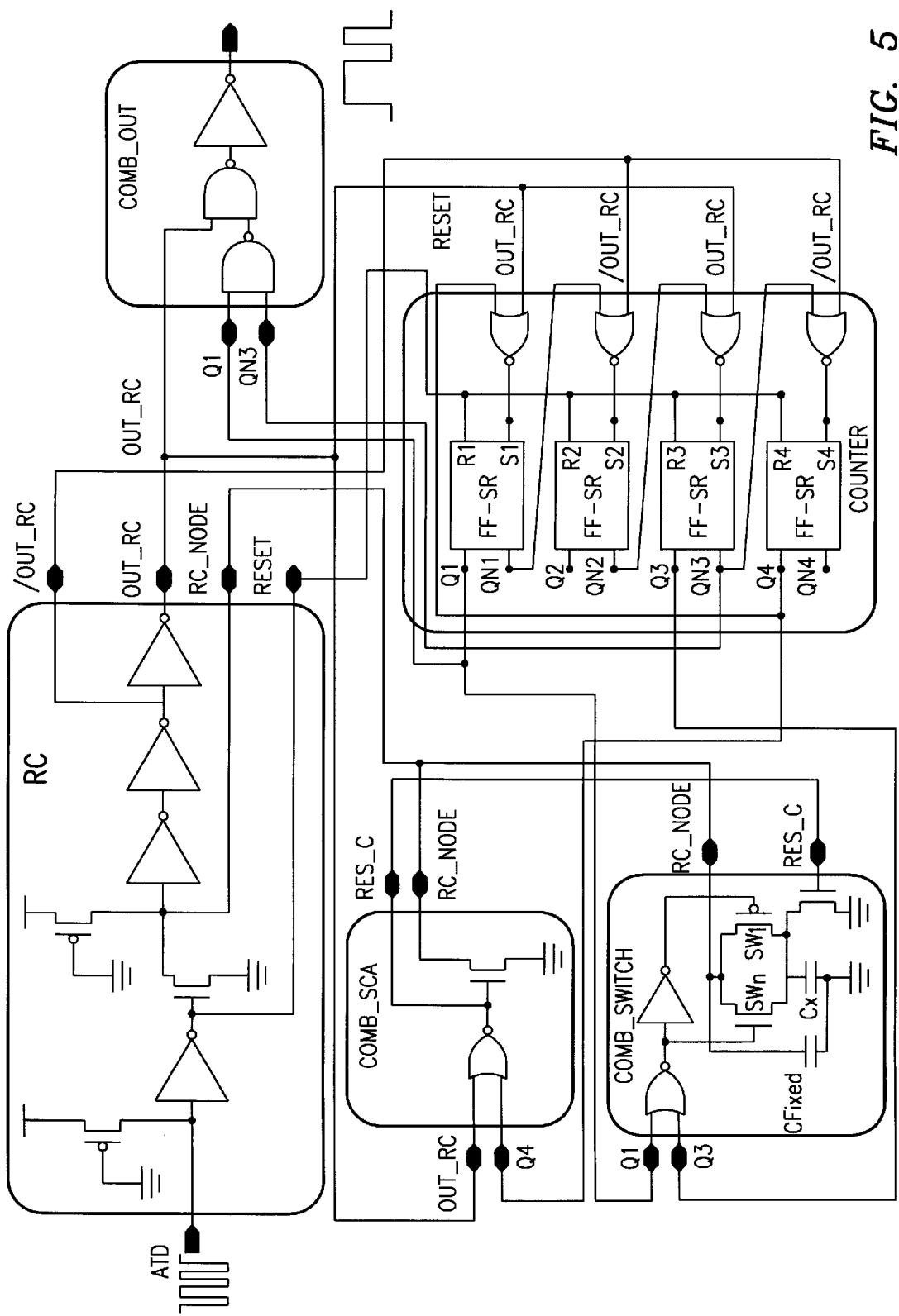
FIG. 5 shows a detailed embodiment thereof.

Depicted in FIG. 5 is an exemplary circuit implementation of the scheme proposed herein. This is capable of generating waveforms with high or low logic states, characterized by two or more possible time durations. FIG. 5 specifically shows the case when two pre-charge operations are required. More specifically, FIG. 5 shows the case when the first sensing phase has the same time duration as the second pre-charge phase. The invention, however, generally accommodates a variable time duration of the charging of node RC_NODE. The time duration of the high level of the waveform generated varies accordingly. In fact, the time duration of the charging operation determines the time duration of the pre-charging and the first sensing phase. Thus, the circuit can generate a timing signal such as that shown in FIG. 1B. The working flow of the underlying functional scheme can be more accurately highlighted by an analysis of its operation.

The input signal to the circuit is the ATD signal, which is assumedly generated in a known manner by a suitable interface circuit to the address bus. This signal produces a discharge pulse for the capacitance associated with the node RC_NODE. At the end of the negative pulse of the ATD signal, this capacitance is charged. In order to have timing pulses output which have varying durations, it is necessary to adjust the charge time constants of this capacitance. This function is served in the circuit by block COMB_SWITCH.

Also provided within this block, as shown in FIG. 5, is the programmable capacitance related to block RC. Notice that, from a functional standpoint, this capacitance belongs to block RC; accordingly, the circuit of FIG. 5 is functionally consistent with the scheme in FIG. 4. The combinational logic of this block is, in the embodiment described, configured to select from two different capacitance values, so that the block RC can output signals characterized by two possible charge times. However, different time duration for each operating phase can be obtained by reconfiguring the block COMB_SWITCH.

The ATD pulse also has a RESET function for the shift counter. Thus, every time an address transition signal is presented at the input, the circuit is caused to reset and initiate the generation of a new timing cycle. This operational feature is of great importance, because the switching of the bus addressing signals usually does not occur instantaneously. It may happen that, as mentioned in the paragraph pertaining to the state of the art, certain address bits are set to the desired value with some delay after the first; in this case, and for the reasons given above, the timing circuitry is to synchronize the reading start with the last ATD pulse.

In the example under consideration, during the first pre-charge phase, which would require approximately 40 ns, the overall capacitance at the node RC_NODE is the parallel of the capacitances CFixed and Cx (CL=CFixed+Cx); during this stage of the operation, transistors SWn and SWp act as shorting switches across the upper terminals of the capacitors. During the first sensing phase, and the second pre-charging phase, capacitor Cx is held discharged to ground (with the transistors SWn, SWp being in a state of high impedance), while the capacitance related to the node RC_NODE is just CFixed (CL=CFixed), a quantity selected to provide a charge time constant of about 15 ns.

Any temperature and/or process effects will affect the duration of all the timing phases in a proportional manner, since the delay block being used is always the same. Particularly in the respect of temperature effects, the expansion of the timing signals as temperature increases, will track the times dictated by the sensing circuitry, with the circuitry effecting a slower reading as temperature increases.

The counter functions to store the system evolution. The state of its outputs Q1, Q2, Q3 and Q4 (QN, QN2, QN3 and QN4 being respectively its complemented outputs) is utilized to drive the combinational logic blocks for generating the discharge pulse, the capacitance selection signals, and the building of the output signal. The truth table for the functional state machine provided is the following:

| Q1 | Q2 | Q3 | Q4 | SYSTEM STATE |
|----|----|----|----|--------------|
| 0  | 0  | 0  | 0  | RESET->start timing->first pre-charge |
| 1  | 0  | 0  | 0  | End phase for first pre-charge |
| 1  | 1  | 0  | 0  | First sensing phase |
| 1  | 1  | 1  | 0  | Start phase for second pre-charge |
| 1  | 1  | 1  | 1  | Second pre-charge->end timing cycle |

Notice that, in the above table, the states corresponding to the configurations of (Q1, Q2, Q3, Q4)=(1,0,0,0) and (Q1, Q2, Q3, Q4)=(1,1,1,0) relate to fast transition states of the counter which have been introduced to avoid problems from critical excursions in the system. Accordingly, the combinational blocks will not be utilizing these states for the purpose of timing control.

From FIG. 4, it is evinced that blocks RC and COMB_SCA form a circuit fed back through the node OUT_RC. This node goes to its high logic state whenever the capacitance at the node RC_NODE is discharged, and undergoes a transition toward a low logic level upon this capacitance reaching the trigger threshold of the inverter in cascade therewith (INV1). This causes CL to be discharged at once, and along with it, produces a new charge phase. The sequence of operations just described continues until the counter output Q4 attains its high logic level, thereby opening the feedback loop that controls the discharge; this results in any further charging and discharging operations being blocked unless a fresh pulse is delivered from ATD, which pulse would reset the counter registers to zero as well as discharge the capacitance of RC.

Finally, the output combinational logic is to build the signal at the node OUT_RC according to the counter state and as shown in the following truth table:

| Q1 | Q3 | FUNCTIONAL STATE | LOGIC FUNCTION |
|----|----|------------------|----------------|
| 0  | 0  | First pre-charge | Output signal = Signal OUT RC |
| 1  | 0  | First sensing    | Output signal = Low logic level |
| 0  | 1  | —                | — Configuration not contemplated — |
| 1  | 1  | Second pre-charge | Output signal = Signal OUT_RC |

Notice that the configuration of the counter outputs for Q1=0 (logic low) and Q3=1 (logic high) is not contemplated, according to the table of the counter states.

The circuit proposed allows timing signals of varying duration to be generated from a single delay block RC. This will optimize the timing phases that make up an operation of full reading from a multi-level cell.

Compared to a solution providing for plural delay blocks, the circuit has the advantage of a reduced area occupation, due especially to the use of a digitally programmable capacitor structure (Cx+CFixed). In addition, the positive temperature drift of the block RC capacitance value affords automatic tracking of the sensing time: a temperature increase causes the generation of phases to have longer durations than nominal. The increase is a proportional one for each phase, and in particular, a longer phase is generated for sensing, sensing actually requiring a longer time under these conditions than in the nominal reading conditions.

The circuit has an auto-RESET function at each transition on the address bus. This makes for optimum synchronization of the decoding/pre-charging/sensing operations upon the last address bit becoming settled.

The structure can be expanded. For reading from multilevel memories with sixteen levels and dichotomic approach, for example, four successive reading steps are necessary, each consisting of a pre-charging phase and a sensing phase. Starting from the circuit proposed, adapted for timing two reading steps, a logic block and additional stages of the counter may be added which can provide the timing for all the required operating phases when more than two reading steps are required.

It should be understood that modifications or integrations may be made unto the embodiment described above without departing from the protection scope of the following claims.

We claim:

1. A timing circuit for reading from a device which comprises non-volatile memory cells of the multi-level type, the circuit having an input terminal for memory address line transition signals and an output terminal for cell read cycle timing signals, and being characterized in that it comprises a single programmable delay block having an input terminal, connected to the transition signal input terminal, and an output terminal, a delay programming terminal, and a control terminal, a counter having an increment input terminal connected to the output terminal of the delay block, a reset terminal connected to the transition signal input terminal, and at least first, second and third output terminals which are respectively connected to the control terminal of the delay block through a control signal generator having an enable terminal connected to the output terminal of the delay block, the programming terminal of the delay block and a control terminal of a logic output circuit which is placed between the output terminal of the delay block and the timing signal output terminal.

2. A timing circuit according to claim 1, wherein the delay block comprises a delay network of the RC type having a programmable capacitance.

3. A timing circuit according to claim 2, wherein the counter is a digital shift counter, the control signal generator is a combinational logic circuit generating discharge pulses for the programmable capacitance, and the single delay block comprises a second combinational logic circuit driven by the counter and operative to program the RC network capacitance.

4. A timing circuit according to claim 2, wherein the RC network comprises an assembly of capacitors and respective switches for programming their charges.

5. A timing circuit according to claim 3, wherein the RC network comprises an assembly of capacitors and respective switches for programming a charge on at least one capacitor of said assembly of capacitors.

6. A timing circuit according to claim 1, wherein the output circuit generates the timing signals by processing the delay block output signals and the counter state.

7. A timing circuit according to claim 2, wherein the output circuit generates the timing signals by processing the delay block output signals and the counter state.

8. A timing circuit according to claim 3, wherein the output circuit generates the timing signals by processing the delay block output signals and the counter state.

9. A timing circuit according to claim 4, wherein the output circuit generates the timing signals by processing the delay block output signals and the counter state.

10. A timing circuit according to claim 5, wherein the output circuit generates the timing signals by processing the delay block output signals and the counter state.

11. A timing circuit according to claim 1, wherein the output counter and control signal generator form a functional state machine.

12. A timing circuit according to claim 2, wherein the output counter and control signal generator form a functional state machine.

13. A timing circuit according to claim 3, wherein the output counter and control signal generator form a functional state machine.

14. A timing circuit according to claim 4, wherein the output counter and control signal generator form a functional state machine.

15. A timing circuit according to claim 5, wherein the output counter and control signal generator form a functional state machine.

16. A timing circuit according to claim 1, for reading from a device comprised of sixteen-level non-volatile memory cells, wherein the circuit comprises a four-stage shift counter.

17. A timing circuit according to claim 2, for reading from a device comprised of sixteen-level non-volatile memory cells, wherein the circuit comprises a four-stage shift counter.

18. A timing circuit according to claim 3, for reading from a device comprised of sixteen-level non-volatile memory cells, wherein the circuit comprises a four-stage shift counter.

19. A timing circuit according to claim 4, for reading from a device comprised of sixteen-level non-volatile memory cells, wherein the circuit comprises a four-stage shift counter.

20. A timing circuit according to claim 5, for reading from a device comprised of sixteen-level non-volatile memory cells, wherein the circuit comprises a four-stage shift counter.

21. A timing circuit according to claim 11, for reading from a device comprised of sixteen-level non-volatile memory cells, wherein the circuit comprises a four-stage shift counter.

22. A device comprising multi-level non-volatile memory cells, wherein the device includes a timing circuit for reading from a device which comprises non-volatile memory cells of the multi-level type, the circuit having an input terminal for memory address line transition signals and an output terminal for cell red cycle timing signals, and wherein the timing circuit comprises a single programmable delay block having an input terminal, connected to the transition signal input terminal, and an output terminal, a delay programming terminal, and a control terminal, a counter having an increment input terminal connected to the output terminal of the delay block, a reset terminal connected to the transition signal input terminal, and at least first, second and third output terminals which are respectively connected to the control terminal of the delay block through a control signal generator having an enable terminal connected to the output terminal of the delay block, the programming terminal of the delay block and a control terminal of a logic output circuit which is placed between the output terminal of the delay block and the timing signal output terminal.

23. The device of claim 22, wherein the delay block comprises a delay network of the RC type having a programmable capacitance.

24. The device of claim 23, wherein the counter is a digital shift counter, the control signal generator is a combinational logic circuit generating discharge pulses for the programmable capacitance, and the single delay block comprises a second combinational logic circuit driven by the counter and operative to program the RC network capacitance.

25. The device of claim 23, wherein the RC network comprises an assembly of capacitors and respective switches for programming their charges.

26. The device of claim 22, wherein the output circuit generates the timing signals by processing the delay block output signals and the counter state.

27. The device of claim 22, wherein the output counter and control signal generator form a functional state machine.

28. The device of claim 22, wherein the device comprises sixteen-level non-volatile memory cells, and wherein the circuit comprises a four-stage shift counter.

* * * * *